United States Patent
Karikalan et al.

(10) Patent No.: US 8,212,149 B2
(45) Date of Patent: Jul. 3, 2012

(54) MUTUAL CAPACITANCE AND MAGNETIC FIELD DISTRIBUTION CONTROL FOR TRANSMISSION LINES

(75) Inventors: Sampath Komarapalayam Velayudham Karikalan, Chandler, AZ (US); Rezaur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 1013 days.

(21) Appl. No.: 12/041,916

(22) Filed: Mar. 4, 2008

(65) Prior Publication Data

US 2009/0223707 A1    Sep. 10, 2009

(51) Int. Cl.
*H05K 1/00* (2006.01)
*H05K 1/03* (2006.01)
*H05K 1/16* (2006.01)

(52) U.S. Cl. ........ 174/255; 174/250; 174/254; 174/260; 361/792; 361/793; 361/794; 361/795; 29/830; 29/842

(58) Field of Classification Search .................. None
See application file for complete search history.

(56) References Cited

U.S. PATENT DOCUMENTS 7,110,263 B2 *   9/2006   He et al. .................... 361/794
7,531,751 B2 *   5/2009   Hosomi et al. ............. 174/250

* cited by examiner

*Primary Examiner* — Ishwarbhai B Patel
*Assistant Examiner* — Dion Ferguson
(74) *Attorney, Agent, or Firm* — Fiala & Weaver P.L.L.C.

(57) ABSTRACT

Magnetic field distribution and mutual capacitance control for transmission lines are provided. A first circuit board is fabricated by attaching a reference plane layer to a dielectric material layer, and attaching a first trace to the second surface of the dielectric material. A surface profile of the reference plane layer is modified to decrease a resistance of a return current signal path through the reference plane layer, to reduce a magnetic field coupling between the first trace and a second trace. A second circuit board is fabricated by attaching a reference plane layer to a dielectric material layer, attaching a trace to the dielectric material, and forming a solder mask layer on the dielectric material layer over the trace. An effective dielectric constant of the solder mask layer is modified to reduce or increase a mutual capacitance between the first trace and a second trace on the dielectric material.

20 Claims, 13 Drawing Sheets

900

902
enable a forward current to flow through a signal line and a corresponding return current to flow through the return signal path of the reference plane that generate a magnetic field 904
reduce a distribution of the magnetic field due to the reduced resistance of the return signal path

1502 enable a forward current to flow through a signal line and a corresponding return current to flow through the return signal path of the reference plane to generate an electric field

1504 reduce a coupling of the electric field between the first trace and the second trace due to the reduced mutual capacitance

FIG. 15

MUTUAL CAPACITANCE AND MAGNETIC FIELD DISTRIBUTION CONTROL FOR TRANSMISSION LINES

BACKGROUND OF THE INVENTION

1. Field of the Invention

The present invention relates to circuit board technology.

2. Background Art

A transmission line is a pair of electrical conductors on a circuit board used to carry an electrical signal and corresponding reference signal. The distribution of a magnetic field within and around a transmission line determines the amount of self-inductance of the transmission line and the mutual-inductance of the transmission line to adjacent signal lines. These inductance values are major factors in defining transmission line characteristics such as crosstalk and characteristic impedance. The amplitude and timing integrity of the signals carried by a transmission line are highly dependent on these two characteristics. The magnetic field distribution of a transmission line is a significant factor in preserving signal integrity, and thus is an important factor in the intended function of a transmission line.

In one configuration, a transmission line may include a signal trace and a reference plane. The signal trace carries the forward electrical signal of the transmission line pair, and the reference plane carries the return current related to the electrical signal. The reference plane may be a ground plane or other voltage plane of a circuit board. The signal trace is typically routed over the reference plane. A layer of a dielectric material separates the signal trace and the reference plane. A net magnetic field around such a transmission line is a vectorial sum of a first magnetic field due to the forward current on the signal trace and a second magnetic field due to the return current on the reference plane. When the return current path on the reference plane is very close in distance and size to the forward current path, the first and second magnetic field components cancel out each other at most locations around the transmission line, due to their opposing phases. In such a case, the net magnetic field tends to be mainly concentrated between the signal trace and the reference plane.

The return current on the reference plane tends to have the highest density under the footprint of the signal trace at higher frequencies, because electromagnetic energy flows in the path of least impedance. However, at lower frequencies, the return current on the reference plane tends to spread outside of the footprint of the signal trace, which can result in a significant amount of net magnetic field fringing from the transmission line to adjacent transmission lines, causing interference.

A common technique used to avoid problems with adjacent transmission lines due to fringing magnetic fields is to add space between transmission lines. Another technique is to add shield traces between transmission lines. These techniques, however, reduce routing density for a given surface area of a circuit board, and may therefore require a body size increase for the circuit board. Such increases in body size result in higher circuit board costs. Thus, improved techniques for avoiding problems with adjacent transmission lines due to fringing magnetic fields are desired.

The mutual capacitance between two adjacent transmission lines on a common circuit board is a major factor in determining important characteristics such as crosstalk and differential impedance (where the adjacent transmission lines belong to a differential pair). The mutual capacitance is directly proportional to the relative permittivity (effective dielectric constant) of the dielectric medium that separates the two transmission lines. The mutual capacitance is directly proportional to the area of overlap between the two transmission lines. Furthermore, the mutual capacitance is inversely proportional to the distance between the two transmission lines.

Thus, the mutual capacitance between two signal traces will increase as the routing density increases (e.g., as the spacing between them decreases). For circuit boards with a reference plane beneath and/or above the signal traces, a proximity of the reference plane(s) to the signal traces aids in reducing mutual capacitance. However, manufacturing challenges and impedance control requirements may pose limitations on how close reference plane(s) can be to signal traces.

As a result, there tends to be some amount of mutual capacitance between adjacent signal traces on a substrate. Furthermore, as the logic noise margins of transmission line signals are reduced, a system level crosstalk budget is also reduced. Thus, techniques for reducing the mutual capacitance between adjacent signal traces are desired that do not compromise routing density.

BRIEF SUMMARY OF THE INVENTION

Methods, systems, and apparatuses for circuit boards with magnetic field distribution control are provided. In a first aspect, a circuit board may be at least partially fabricated by attaching a reference plane layer to a first surface of a dielectric material layer, and attaching a first trace to a second surface of the dielectric material. A surface profile of the reference plane layer is modified to decrease a resistance of a return current signal path through the reference plane layer, to reduce a magnetic field coupling between the first trace and a second trace on the dielectric material.

The surface profile of the reference plane layer may be modified by forming a first portion of the reference plane layer that is opposite the first trace to have a thickness that is greater than a thickness of a second portion of the reference plane layer adjacent to the first portion. For example, a trench may be formed in the reference plane layer in the second portion of the reference plane layer. In another example, a protruding portion may be formed along the first portion of the reference plane layer directly opposite the first trace. In still another example, one or more openings may be formed in the reference plane layer in the second portion of the reference plane layer.

Methods, systems, and apparatuses for circuit boards with mutual capacitance control are provided. In an aspect, a circuit board may be at least partially fabricated by attaching a reference plane layer to a dielectric material layer, attaching a first trace to the dielectric material, and forming an insulating layer on the dielectric material layer over the first trace. An effective dielectric constant of the insulating layer is modified to reduce a mutual capacitance between the first trace and a second trace on the dielectric material.

The effective dielectric constant of the insulating layer may be modified by forming a first portion of the insulating layer over the first trace to have a thickness that is greater than a thickness of a second portion of the insulating layer adjacent to the first portion of the solder mask layer. For example, a trench may be formed in a surface of the insulating layer in the second portion of the solder mask layer.

In a further aspect, a circuit board may be at least partially fabricated by attaching a reference plane layer to a dielectric material layer, attaching a pair of traces to the dielectric material, and forming an insulating layer on the dielectric material layer over the traces. An effective dielectric constant of the insulating layer is modified to increase a mutual capacitance between the pair of traces.

The effective dielectric constant of the insulating layer may be modified by forming a protruding portion that protrudes from the insulating layer over the pair of traces to increase a mutual capacitance between the pair of traces.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 9 shows a flowchart providing a process for operating a circuit board, according to an embodiment of the present invention.

FIG. 15 shows a flowchart providing a process for operating a circuit board, according to an embodiment of the present invention.

Figure 1:
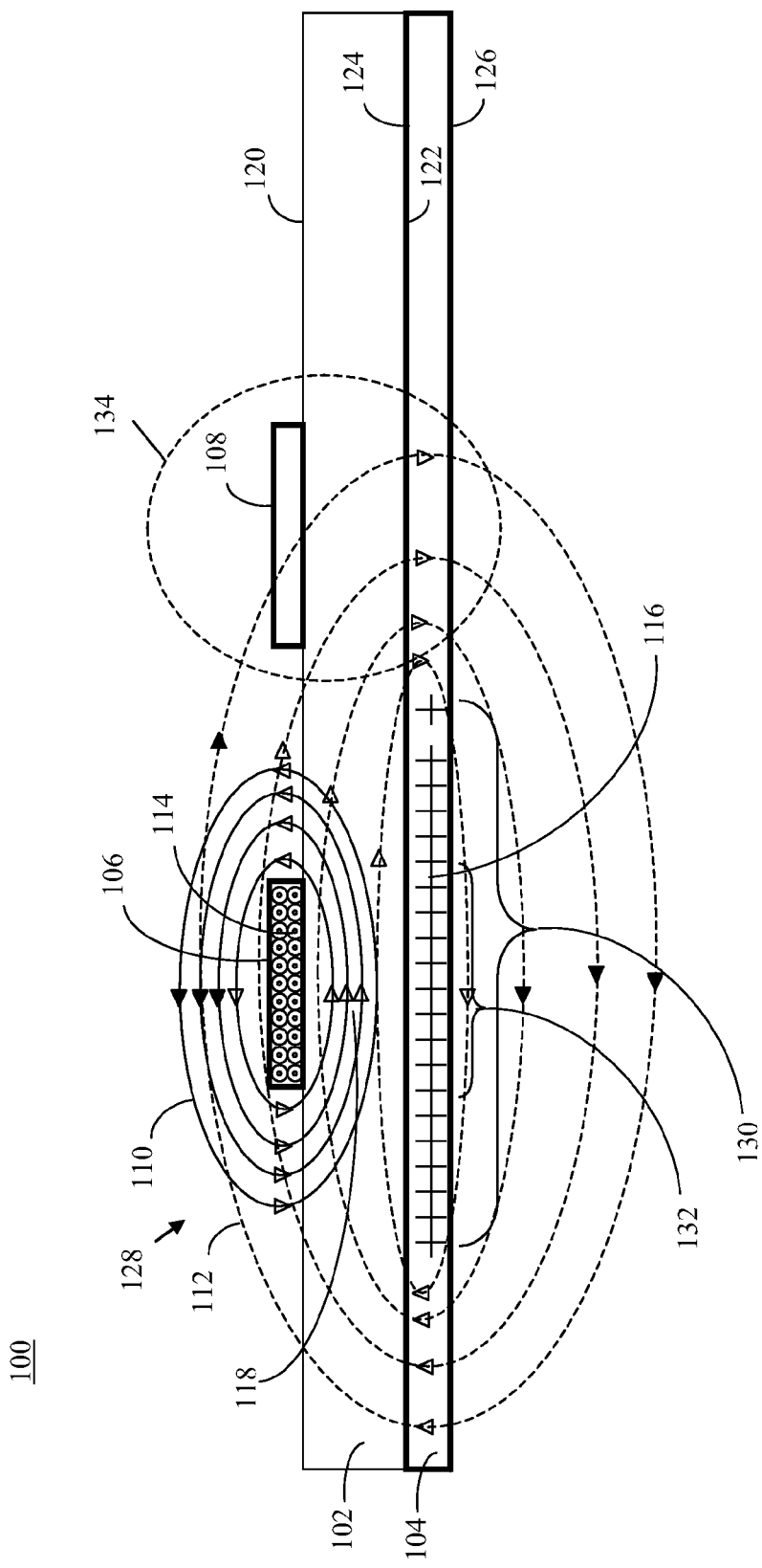
FIG. 1 shows a cross-sectional view of a circuit board that includes a transmission line, and shows magnetic fields related to the transmission line.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Example Magnetic Field Distribution Control Embodiments

Embodiments for controlling a magnetic field distribution around signal conductors of a circuit board are provided in this section. In embodiments, a surface profile of a reference plane of the circuit board above and/or below the signal conductors is modified to reduce an overall magnetic field distribution. The magnetic field distribution is reduced in a manner that does not adversely impact routing density.

The example embodiments described herein are provided for illustrative purposes, and are not limiting. Although described below with reference to printed circuit boards (PCBs) and integrated circuit package substrates, the examples described herein may be adapted to other types of circuit boards. Furthermore, additional structural and operational embodiments, including modifications/alterations, will become apparent to persons skilled in the relevant art(s) from the teachings herein.

A transmission line is a pair of electrical conductors on a circuit board used to carry an electrical signal and a corresponding reference signal. The distribution of a magnetic field within and around a transmission line determines the amount of self-inductance of the transmission line and the mutual-inductance of the transmission line to adjacent signal lines. These inductance values are important factors in defining transmission line characteristics such as crosstalk and characteristic impedance. The amplitude and timing integrity of the signals carried by a transmission line are highly dependent on these characteristics. The magnetic field distribution of a transmission line is a significant factor in preserving signal integrity, and thus is an important factor in the intended function of that transmission line.

Figure 2:
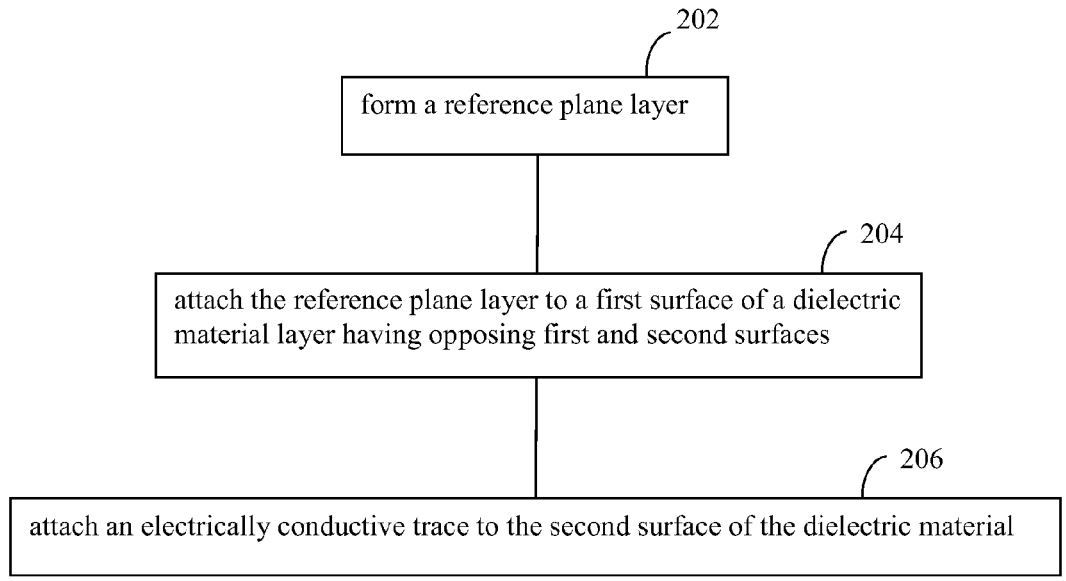
FIG. 2 shows a flowchart for forming a circuit board.

Transmission lines can be configured in various ways. In one configuration, a transmission line may include a signal trace and a reference plane. FIG. 1 shows a cross-sectional view of a circuit board 100 that includes such a transmission line. As shown in FIG. 1, circuit board 100 includes a dielectric material layer 102, a reference plane layer 104, and first and second electrical conductors 106 and 108. FIG. 2 shows a flowchart 200 for forming a circuit board that includes a transmission line, such as circuit board 100. Flowchart 200 is described below.

In step 202 of flowchart 200, a reference plane layer is formed. As shown in the example of FIG. 1, reference plane layer 104 has opposing surfaces 124 and 126. Reference plane layer 104 may be formed in any manner, as would be known to persons skilled in the relevant art(s). For example, reference plane layer 104 may be formed or received as a sheet, such as a foil, that includes one or more layers of electrically conductive material(s). For instance, reference plane layer 104 may be a metal, such as copper, aluminum, gold, silver, tin, nickel, lead, or a combination of metals/alloy, or may be formed of an alternative electrically conductive material. Reference plane layer 104 may be configured to function as a ground plane or other voltage plane for circuit board 100.

In step 204, the reference plane layer is attached to a first surface of a dielectric material layer having opposing first and second surfaces. As shown in FIG. 1, first surface 124 of reference plane layer 104 is attached to a first surface 122 of dielectric material layer 102. Reference plane layer 104 and dielectric material layer 102 may be attached together in any manner, including according to conventional circuit board fabrication techniques, as would be known to persons skilled in the relevant art(s). For example, reference plane layer 104 and dielectric material layer 102 may be attached using an adhesive material (e.g., an epoxy), by a lamination process, or in any other manner. Dielectric material layer 102 may include any electrically insulating or dielectric material, including an organic, plastic, ceramic, and/or tape material. Example materials for dielectric material layer 102 include materials such as polyimide, "BT", which includes a resin called bis-maleimide triazine, "FR-4," which is a fire-retardant epoxy resin-glass cloth laminate material, "FR-5," and/or other similar materials. Circuit board 100 may include further layers in additional to reference plane layer 104 and dielectric material layer 102. A multi-layered version of circuit board 100 may be formed from alternating layers of electrically conductive materials and electrically insulating materials. Circuit board 100 may be a printed circuit board (PCB), a substrate of an integrated circuit package, or any other type of circuit board.

In step 206, an electrically conductive trace is attached to the second surface of the dielectric material. For instance, the electrically conductive trace may be first electrical conductor 106. First electrical conductor 106 may be formed during a separate fabrication process or during a same fabrication process as used to form second electrical conductor 108. As shown in FIG. 1, first electrical conductor 106 and second electrical conductor 108 are attached to a second surface 120 of dielectric material layer 102. First and second electrically conductive traces 106 and 108 may be formed in any manner, as would be known to persons skilled in the relevant art(s). For example, first and second electrically conductive traces 106 and 108 may be formed from a sheet that includes one or more layers of electrically conductive material(s), such as a metal foil. An etching process or other process may be used to define first electrical conductor 106 and second electrical conductor 108 in the sheet. First and second electrically conductive traces 106 and 108 may be formed of a metal, such as copper, aluminum, gold, silver, tin, nickel, lead, or a combination of metals/alloy, or may be formed of an alternative electrically conductive material. First and second electrically conductive traces 106 and 108 may be attached to dielectric material layer 102 in any manner, including using an adhesive material (e.g., an epoxy), by a lamination process, or in any other suitable manner, as would be known to persons skilled in the relevant art(s).

Note that further steps/processes may be performed to form a circuit board in addition to those shown in flowchart 200. Such additional processes are not shown in flowchart 200 for purposes of brevity. For example, a layer of insulating material (e.g., a solder mask layer) may be formed on surface 120 of dielectric material layer 102 over electrical conductors 106 and 108, and/or further processes may be performed, as would be known to persons skilled in the relevant art(s).

Dielectric material layer 102 separates first electrical conductor 106 and reference plane layer 104. First electrical conductor 106 and reference plane layer 104 form a transmission line 128 of circuit board 100. First electrical conductor 106 carries an electrical signal (e.g., a forward current) of transmission line 128, and reference plane layer 104 carries a return current of transmission line 128. In the example of FIG. 1, a direction of the forward electrical current of the electrical signal flowing through first electrical conductor 106 is indicated by a first indicator 114 (as flowing out of the page). A direction of the return current flowing through reference plane layer 104 is indicated in FIG. 1 by a second indicator 116 (as flowing into the page). A net magnetic field around transmission line 128 is a vectorial sum of a first magnetic field 110 due to the forward current on first electrical conductor 106 and a second magnetic field 112 due to the return current on reference plane layer 104. Due to the "right hand rule," first magnetic field 110 has a counter clockwise direction around first electrical conductor 106, and second magnetic field 112 has a clockwise direction. When the return current path in reference plane layer 104 is closely adjacent to that of the forward current path through first electrical conductor 106, first and second magnetic fields 110 and 112 substantially cancel out each other at most locations around transmission line 128, due to their opposing phases. In such a situation, a resulting net magnetic field tends to be mainly concentrated in a region 118 between first electrical conductor 106 and reference plane layer 104.

At higher frequencies, the return current in reference plane layer 104 tends to have a highest density in a footprint portion 132 of reference plane layer 104, because electromagnetic energy flows in the path of least impedance. Footprint portion 132 is a portion of reference plane layer 104 that is closely adjacent to first electrical conductor 106, and may have a width similar to a width of first electrical conductor 106. At lower frequencies, the return current in reference plane layer 104 tends to spread wider than footprint portion 132, throughout a spread return current portion 130 of reference plane layer 104. The wider spread of the return current at lower frequencies results causes a broader second magnetic field 112, which results in a significant amount of the net magnetic field from transmission line 128 fringing with adjacent transmission lines, such as a second transmission line 134 formed by second electrical conductor 108 and reference plane layer 104.

A common technique that may be used to reduce problems due to fringing magnetic fields is to add space between transmission line 128 and any adjacent transmission lines. This technique provides additional space for the magnetic field to spread without as much interference with adjacent transmission lines. Another technique is to add additional shield traces between transmission line 128 and any adjacent transmission lines. The shield traces aid in reducing a spread of the magnetic field due to transmission line 128. These techniques, however, reduce routing density for a given surface area of circuit board 100, and may therefore require a body size increase for circuit board 100. Such increases in body size are undesirable, as they result in higher circuit board costs, and may prevent the circuit board from being used in some applications (e.g., may not be used in small profile devices).

Figure 3:
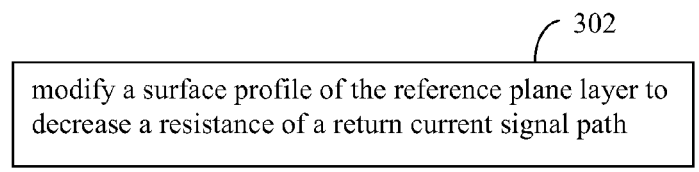
FIG. 3 shows a process for modifying a reference plane layer to reduce a fringing magnetic field generated by a transmission line, according to an example embodiment of the present invention.

Embodiments of the present invention reduce the fringing magnetic field generated by a transmission line, and thus enable reduced spacing between adjacent transmission lines of a circuit board. FIG. 3 shows a process for modifying a reference plane layer to reduce the fringing magnetic field generated by a transmission line, according to an example embodiment of the present invention. FIG. 3 shows a step 302, which may be incorporated into flowchart 200 shown in FIG. 2. For example, step 302 may be performed during step 202 of flowchart 200. Step 302 is described below. Other structural and operational embodiments will be apparent to persons skilled in the relevant art(s) based on the discussion regarding step 302.

In step 302, a surface profile of the reference plane layer is modified to decrease a resistance of a return current signal path. For example, referring to FIG. 1, a surface profile of reference plane layer 104 may be modified to decrease a resistance of reference plane layer 104 in a region where the return current corresponding to the electrical signal of first electrical conductor 106 flows. For example, a surface profile of reference plane layer 104 may be modified to decrease a resistance within footprint region 132 of reference plane layer 104.

Figure 4:
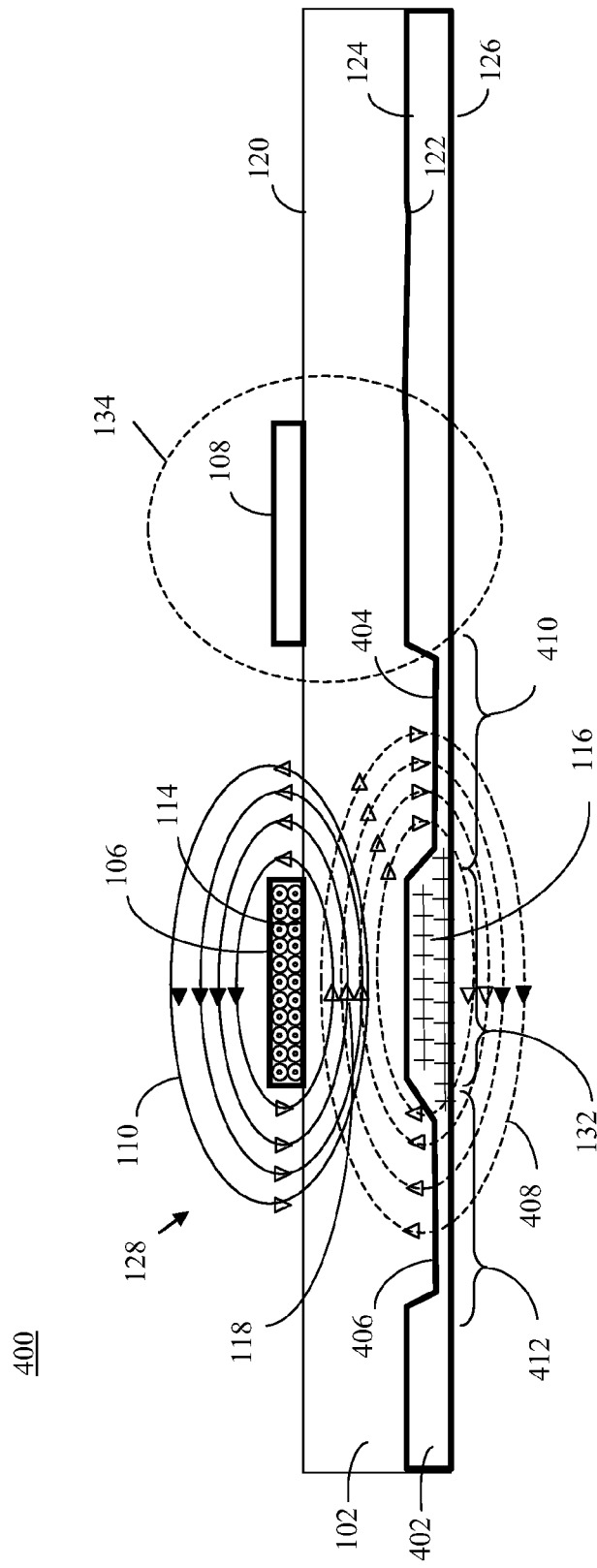
FIG. 4 shows a cross-sectional view of a circuit board having a modified reference plane layer, according to an example embodiment of the present invention.
Figure 5:
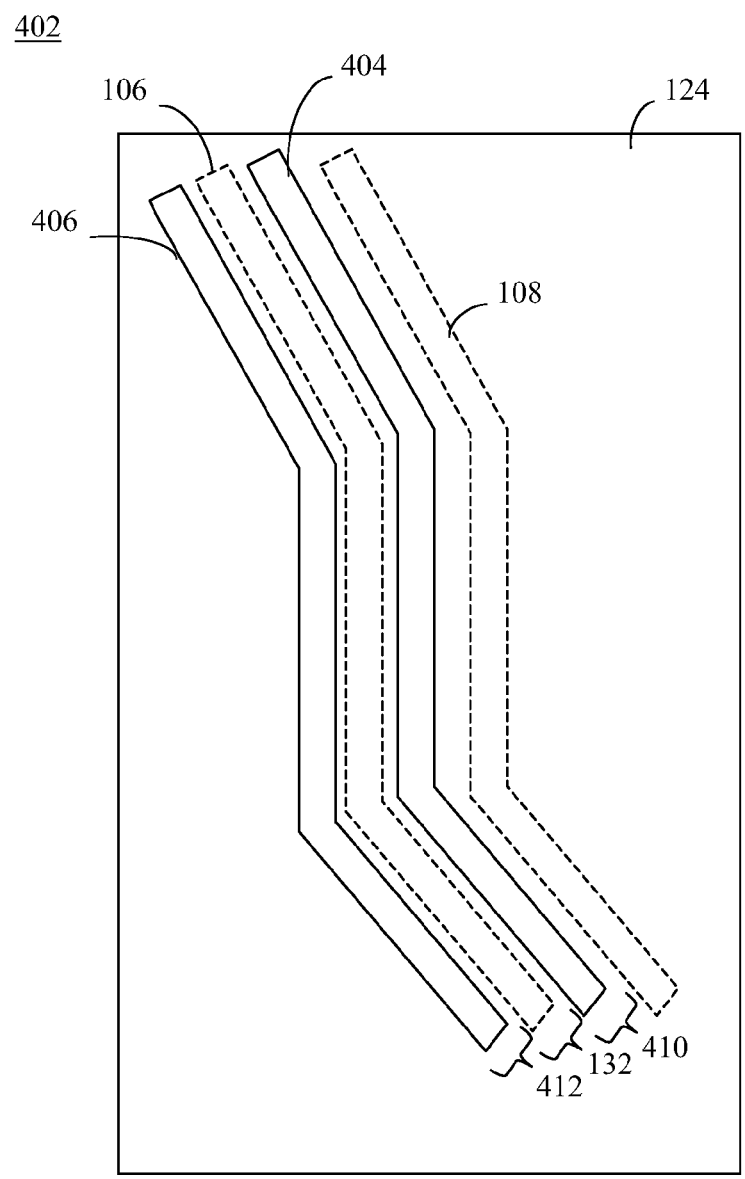
FIGS. 5 and 6 show views of surfaces of reference plane layers, according to example embodiments of the present invention.

FIG. 4 shows a cross-sectional view of a circuit board 400 having a modified reference plane layer, according to an example embodiment of the present invention. Circuit board 400 is similar to circuit board 100 shown in FIG. 1, with differences described below. As shown in FIG. 4, circuit board 400 includes dielectric material layer 102, a reference plane layer 402, and first and second electrical conductors 106 and 108. Reference plane layer 402 has opposing surfaces 124 and 126. First surface 122 of dielectric material layer 102 is attached to first surface 124 of reference plane layer 402. FIG. 5 shows a view of first surface 124 of reference plane layer 402, according to an example embodiment of the present invention. In FIG. 5, for ease of illustration, dielectric material layer 102 is transparent, and thus is not visible, and first and second electrical conductors 106 and 108 are shown as dotted lines, to indicate their positions relative to reference plane layer 402. As shown in FIGS. 4 and 5, first surface 124 of reference plane layer 402 is modified (according to step 302) to include a first trench 404 and a second trench 406. First trench 404 is formed alongside and adjacent to footprint portion 132 in a portion 410 of reference plane layer 104 between first and second transmission lines 128 and 134. Second trench 406 is formed alongside and adjacent to footprint portion 132 in a portion 412 of reference plane layer 104 on an opposite side of footprint portion 132 from first trench 404.

The formation of first and second trenches 404 and 406 in reference plane layer 402 modifies reference plane layer 402 such that a thickness of reference plane layer 402 in a region adjacent to first electrical conductor 106 (footprint portion 132) is greater relative to a thickness of reference plane layer 402 in other areas (first and second trenches 404 and 406). Such a configuration reduces a path resistance for the return current flowing through reference plane layer 402. In this manner, the return current is channeled to flow through footprint portion 132 adjacent to first electrical conductor 106, reducing a spread of the return current as in the configuration of FIG. 1. By focusing the return current in footprint portion 132, a second magnetic field 408 generated by the return current on the reference plane has a reduced scope (relative to second magnetic field 112 shown in FIG. 1). The extent of the fringing magnetic field due to second magnetic field 408 is reduced, and adjacent transmission line 134 accordingly receives a reduced amount of interference from transmission line 128.

Figure 6:
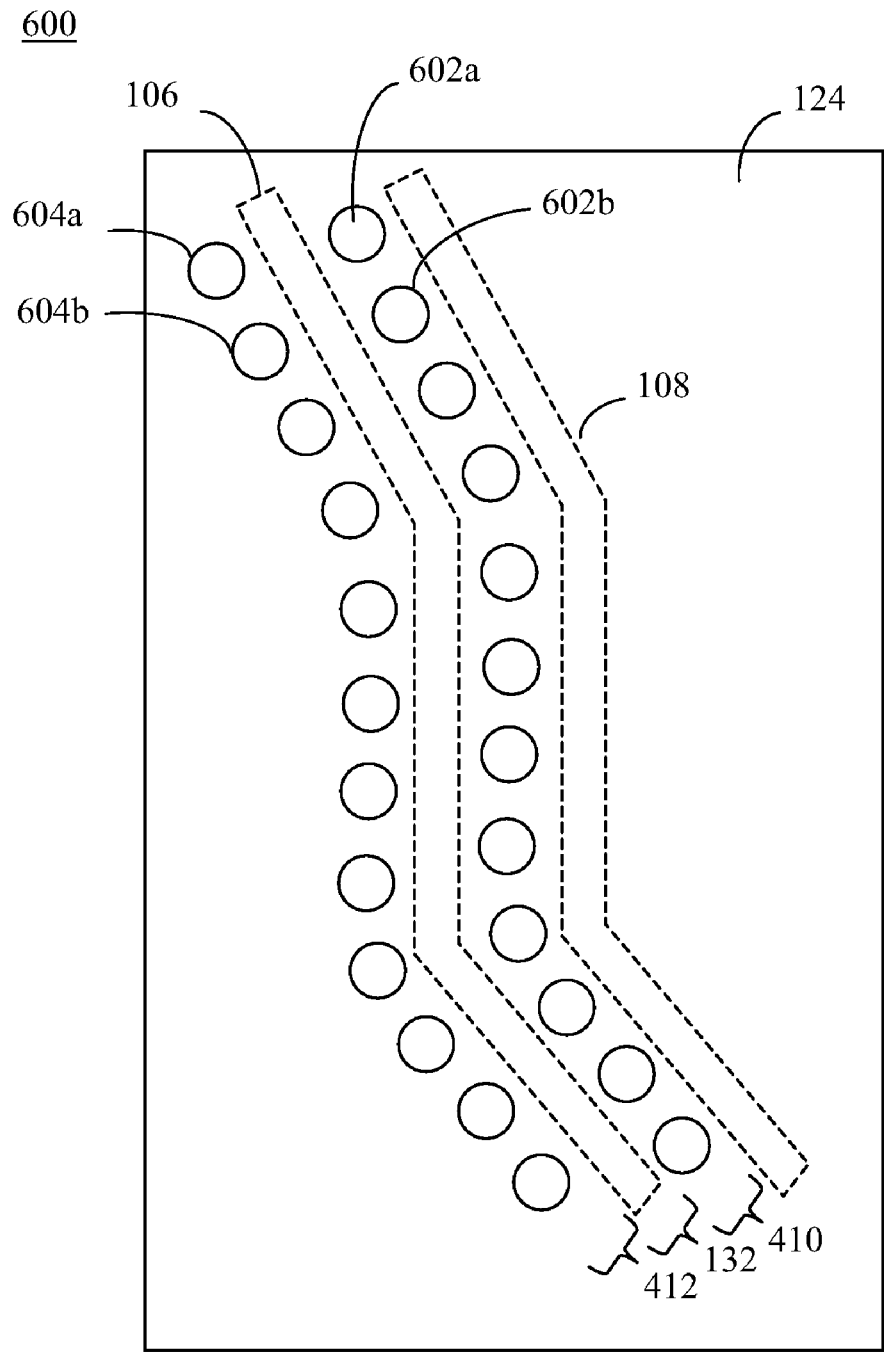

Note that the forms of first and second electrical conductors 106 and 108 shown in FIG. 5 are provided for purposes of illustration. First and second electrical conductors 106 and 108 may be electrically conductive traces or other electrically conductive features having any suitable width, length, shape, and number of turns, that may be routed across/through a circuit board in any configuration, as would be known to persons skilled in the relevant art(s). Likewise, the shapes of first and second trenches 404 and 406 shown in FIGS. 5 and 6 are provided for purposes of illustration. First and second trenches 404 and 406 may have any suitable width, length, depth, shape, and number of turns/angled portions, corresponding to one or more adjacent electrical conductors (e.g., first electrical conductor 106), as would be understood by persons skilled in the relevant art(s) in light of the teachings provided herein. Although shown as having a trapezoidal cross section in FIG. 4, first and second trenches 404 and 406 may have rectangular or other shaped cross-sections. A width and/or depth of trenches 404 and 406 may be selected to adjust a magnetic field scope. Trenches 404 and 406 may be formed in any manner, including by etching, drilling, laser, or by other technique.

FIG. 6 shows a view of first surface 124 of a reference plane layer 600, according to another example embodiment of the present invention. Reference plane layer 600 is similar to reference plane layer 402 of FIGS. 4 and 5, with differences described as follows. As shown in FIG. 6, first surface 124 of reference plane layer 402 is modified (according to step 302) to include a first plurality of openings 602 (including openings 602a and 602b) and a second plurality of openings 406 (including openings 604a and 604b), rather than trenches 404 and 406. In FIG. 6, for ease of illustration, dielectric material layer 102 is transparent, and thus is not visible, and first and second electrical conductors 106 and 108 are shown as dotted lines, to indicate their positions relative to openings 602 in reference plane layer 600. Openings 602 are formed in portion 410 of reference plane layer 600 alongside and adjacent to footprint portion 132 between first and second transmission lines 128 and 134. Openings 604 are formed in portion 412 of reference plane layer 600 alongside and adjacent to footprint portion 132 on an opposite side of footprint portion 132 from openings 602. Openings 602 and 604 may be formed partially through reference plane layer 600 (e.g., may be open at one of surfaces 124 and 126), or may be formed completely through reference plane layer 600 (open at both of surfaces 124 and 126).

Similarly to trenches 404 and 406 shown in FIGS. 4 and 5, the formation of openings 602 and 604 in reference plane layer 600 modifies reference plane layer 600 such that a greater amount of material of reference plane layer 402 is present opposite first electrical conductor 106 (in footprint portion 132) relative to an amount of material of reference plane layer 402 in adjacent areas (portions 410 and 412). Such a configuration reduces a path resistance for the return current (due to the electrical signal carried by first electrical conductor 106) flowing through reference plane layer 402. In this manner, return current is channeled to flow adjacent to first electrical conductor 106 on reference plane layer 402 through footprint portion 132, reducing the spread of return current as in the configuration of FIG. 1. By focusing the return current in footprint portion 132, the magnetic field generated by the return current on reference plane layer 600 has a reduced scope (relative to second magnetic field 112 shown in FIG. 1). Thus, the extent of the fringing magnetic field due to the second magnetic field is reduced (in a similar manner as shown in FIG. 4), and adjacent transmission line 134 receives a reduced amount of interference from transmission line 128.

Note that the shapes, sizes, and distribution of openings 602 and 604 shown in FIG. 6 are provided for purposes of illustration. Openings 602 in portion 410 of reference plane layer 600, and openings 604 in portion 412 of reference plane layer 600 may have any suitable size, shape, depth, spacing, and number, as would be known to persons skilled in the relevant art(s). For example, openings 602 and 604 may have alternative shapes, such as rectangular (e.g., square), triangular, other polygon, or irregular shape, as desired for a particular application. A spacing and/or size of openings 602 and 604 may be selected to adjust a magnetic field scope. Openings 602 and 604 may be formed in any manner, including by etching, drilling, laser, or by other technique.

Figure 7:
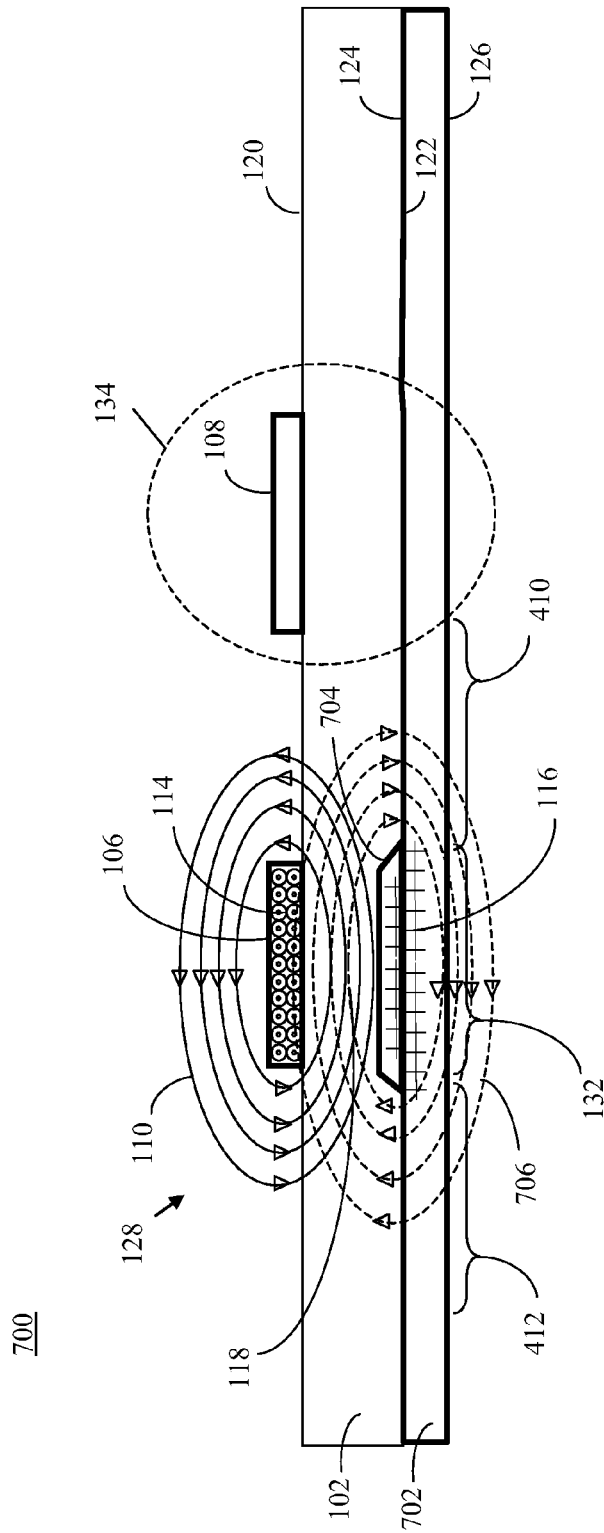
FIGS. 7 and 8 show cross-sectional views of circuit boards having modified reference plane layers, according to example embodiments of the present invention.

FIG. 7 shows a cross-sectional view of a circuit board 700 having a modified reference plane layer, according to another example embodiment of the present invention. Circuit board 700 is similar to circuit board 100 shown in FIG. 1, with differences described below. As shown in FIG. 7, circuit board 700 includes dielectric material layer 102, a reference plane layer 702, and first and second electrical conductors 106 and 108. Reference plane layer 702 has opposing surfaces 124 and 126. First surface 122 of dielectric material layer 102 is attached to first surface 124 of reference plane layer 702.

Reference plane layer 702 is similar to reference plane layer 104 of FIG. 1, with differences described as follows. As shown in FIG. 7, first surface 124 of reference plane layer 702 is modified (according to step 302) to include a protruding portion 704 in and along footprint portion 132 directly opposite first electrical conductor 106. The formation of protruding portion 704 in reference plane layer 702 modifies reference plane layer 702 such that a greater amount of material is present opposite first electrical conductor 106 (in footprint portion 132) relative to an amount of material of reference plane layer 702 in adjacent areas (portions 410 and 412). Such a configuration reduces a path resistance for the return current (due to the electrical signal carried by first electrical conductor 106) flowing through reference plane layer 702. In this manner, a return current is channeled to flow adjacent to first electrical conductor 106 on reference plane layer 702 through footprint portion 132, thereby reducing the spread of return current as in the configuration of FIG. 1 (spread return current portion 130). By focusing the return current in footprint portion 132, a second magnetic field 706 generated by the return current on reference plane layer 702 has a reduced scope (relative to second magnetic field 112 shown in FIG. 1). Thus, the extent of the fringing magnetic field due to second magnetic field 706 is reduced, and adjacent transmission line 134 receives a reduced amount of interference from transmission line 128.

As shown in FIG. 7, protruding portion 704 may have a width approximately equal to the width of first electrical conductor 106. In other embodiments, protruding portion 704 may have a width greater than or less than a width of first electrical conductor 106. A height of protruding portion 704 from surface 124 may be greater than, equal to, or less than (as shown in FIG. 7) an average thickness of reference plane layer 702. The shape, width, and height of protruding portion 704 shown in FIG. 7 are provided for purposes of illustration. Protruding portion 704 may have any suitable size, shape, height, and width, as would be known to persons skilled in the relevant art(s). For example, protruding portion 704 may have a planar shape (as in FIG. 7), may be rounded, or may have other shape, as desired for a particular application. A size of protruding portion 704 may be selected to adjust a magnetic field scope.

Protruding portion 704 may be formed in any manner. For example, in an embodiment, protruding portion 704 may be a strip of conductive material that is attached to surface 124. Protruding portion 704 may be attached to surface 124 in any manner, including by an adhesive material (e.g., an epoxy), by lamination, by printing conductive material on surface 124, by plating conductive material on surface 124, or in any other manner. Protruding portion 704 may be a same or different material from reference plane layer 702, including a metal such as copper, aluminum, gold, silver, tin, nickel, lead, or a combination of metals/alloy, or may be formed of other electrically conductive material. In another embodiment, protruding portion 704 is an integral part of reference plane layer 702, and thus may be formed during the fabrication process for reference plane layer 702. For example, reference plane layer 702, with protruding portion 704, may be formed in a mold, or by stamping a sheet of electrically conductive material.

Figure 8:
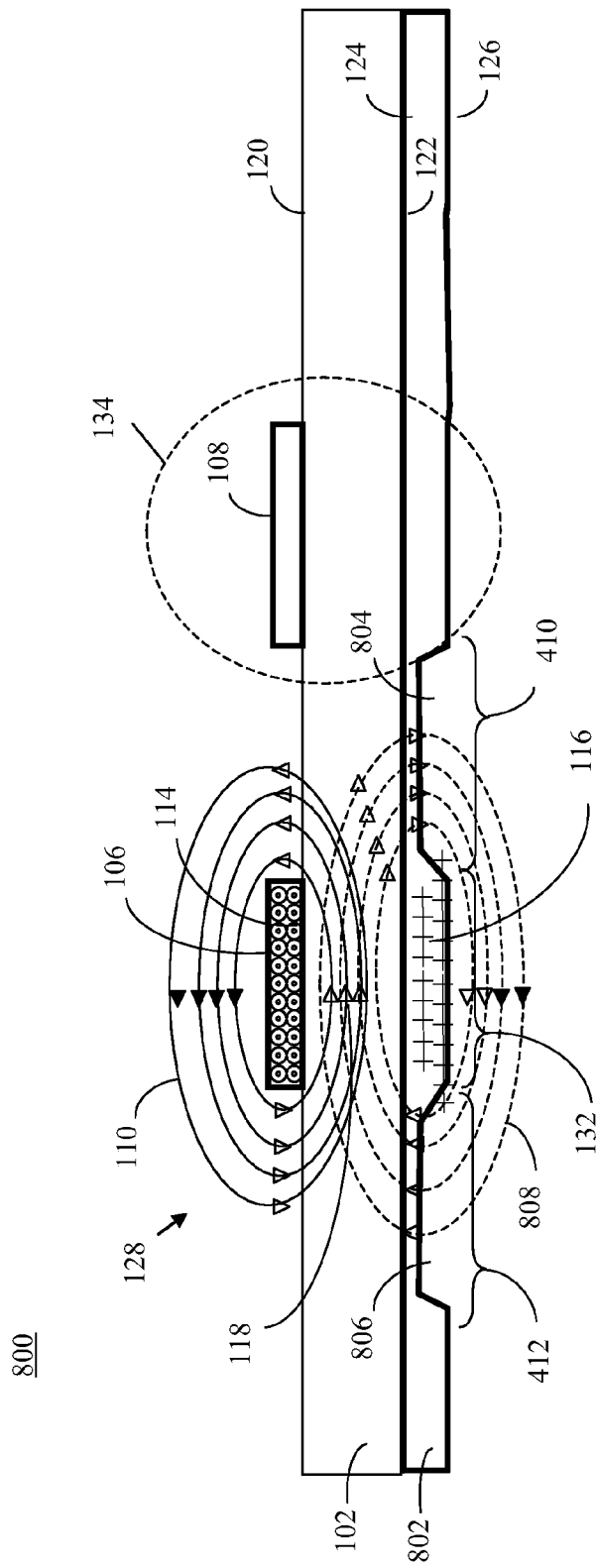

FIG. 8 shows a cross-sectional view of a circuit board 800 having a modified reference plane layer, according to another example embodiment of the present invention. Circuit board 800 is similar to circuit board 400 shown in FIG. 4, with differences described below. As shown in FIG. 8, circuit board 800 includes dielectric material layer 102, a reference plane layer 802, and first and second electrical conductors 106 and 108. Reference plane layer 802 has opposing surfaces 124 and 126. First surface 122 of dielectric material layer 102 is attached to first surface 124 of reference plane layer 802.

Reference plane layer 802 is similar to reference plane layer 402 of FIG. 1, with differences described as follows. As shown in FIG. 8, second surface 126 of reference plane layer 802 (rather than first surface 124, as in FIG. 4) is modified (according to step 302) to include a first trench 804 and a second trench 806. First trench 804 is formed alongside and adjacent to footprint portion 132 in portion 410 of reference plane layer 104 between first and second transmission lines 128 and 134. Second trench 806 is formed alongside and adjacent to footprint portion 132 in portion 412 of reference plane layer 104 on an opposite side of footprint portion 132 from first trench 804. First and second trenches 804 and 806 may be formed in reference plane layer 802 prior to or after attachment of reference plane layer 802 to dielectric material layer 102.

The formation of first and second trenches 804 and 806 in reference plane layer 802 modifies reference plane layer 802 such that a thickness of reference plane layer 802 in a region adjacent to first electrical conductor 106 (footprint portion 132) is greater relative to a thickness of reference plane layer 802 in other areas (first and second trenches 404 and 406). Such a configuration reduces a path resistance for the return current flowing through reference plane layer 802. In this manner, the return current is channeled to flow through footprint portion 132 adjacent to first electrical conductor 106, reducing a spread of the return current as in the configuration of FIG. 1. By focusing the return current in footprint portion 132, a second magnetic field 808 generated by the return current on the reference plane has a reduced scope (relative to second magnetic field 112 shown in FIG. 1). The extent of the fringing magnetic field due to second magnetic field 808 is reduced, and adjacent transmission line 134 accordingly receives a reduced amount of interference from transmission line 128.

Trenches 804 and 806 may have shapes and may be formed in reference plane layer 802 in a similar manner to trenches 404 and 406 described above with respect to FIGS. 4 and 5.

Note that in a further embodiment, trenches may be formed in both of surfaces 124 and 126 of a reference plane to channel the return current to flow through footprint portion 132 of reference plane layer 802. For example, trenches 404 and 406 (of FIG. 4) may be formed first surface 124 and trenches 804 and 806 (of FIG. 8) may be formed in second surface 126 of a reference plane layer. Furthermore, in another embodiment, trenches formed adjacent to footprint portion 132 (in first and/or second surfaces 124 and 126 of a reference plane) may be combined with a protruding portion formed in footprint portion 132 of a reference plane to channel a return current through footprint portion 132.

Thus, in embodiments, a reference plane layer (e.g., reference plane layers 402, 600, 702, 802) may be formed such that a first portion of the reference plane layer (e.g., footprint portion 132) along and directly opposite an electrical conductor includes a first amount of an electrically conductive material, and a second portion of the reference plane layer adjacent to the first portion (e.g., portion 410 and/or portion 412) includes a second amount of an electrically conductive material. The reference plane layer may be formed such that the first amount of the electrically conductive material is greater than the second amount. In this manner, as described above with respect to FIGS. 4-8, a return current is channeled to flow directly underneath or above the electrical conductor, depending on the configuration, to reduce a spread of the return current. By focusing the return current, a magnetic field generated by the return current has a reduced scope (relative to second magnetic field 112 shown in FIG. 1), and thus a fringing magnetic field is reduced.

FIG. 9 shows a flowchart 900 providing a process for operating a circuit board, according to an embodiment of the present invention. For example, a circuit board including any of reference plane layers 402, 600, 702, and 802 of FIGS. 4-8 may be operated according to flowchart 900. Flowchart 900 begins with step 902. In step 902, a forward current is enabled to flow through a signal line and a corresponding return current is enabled to flow through the return signal path of the reference plane that generate a magnetic field. The circuit board may mount one or more electrical components coupled to transmission line 128. During operation of the electrical components, a forward current may flow through first electrical conductor 106, and a corresponding return current may flow through reference plane layers 402, 600, 702, and/or 802. In step 904, a distribution of the magnetic field due to the reduced resistance of the return signal path is reduced. As described above, by configuring reference plane layers 402, 600, 702, and 802 to have a greater amount of electrically conductive material directly opposite first electrical conductor 106 relative to adjacent portions, the return current path has reduced resistance. The reduced resistance leads to less spread of the return current, which reduces a distribution of a generated magnetic field, which leads to less magnetic field fringing. In this manner, transmission lines of a circuit board can be configured to generate less interference, and may be formed more closely together, if desired.

Note that in another embodiment, a transmission line may include two electrical conductors on surface 120 of dielectric material layer 102. For example, first and second electrical conductors 106 and 108 may form a differential transmission line pair. In such an embodiment, the surface profile of a reference plane layer may be modified so that the greater amount of material covers a footprint of both electrical conductors. For example, with respect to the embodiment of FIGS. 4 and 8, a trench may be formed on each side of the differential pair (e.g., in FIG. 4, trench 404 may be formed on the right side of conductor 108, while trench 406 remains as located in FIG. 4). With respect to the embodiment of FIG. 6, openings may be formed on each side of the differential pair (e.g., openings 602 may be formed on the right side of conductor 108, while openings 604 remain as located in FIG. 6). With respect to the embodiment of FIG. 7, protruding portion 704 may be widened to extend underneath electrical conductor 108. In each case, a first portion of the reference plane layer opposite the electrical conductor pair includes a first amount of an electrically conductive material that is greater than an amount of electrically conductive material in a second portion of the reference plane layer adjacent to the first portion. In this manner, reference plane currents for the individual conductors of a differential pair more effectively cancel when differentially driven.

Embodiments enable improved crosstalk performance without compromising the routing density of electrical conductors over a common reference plane. Furthermore, the characteristic impedance of a transmission line may be controlled, without having to change a width of the electrical conductors or a thickness of the dielectric material layer. In further embodiments, thickness changes on the surface of the reference plane layer may be formed elsewhere on the reference plane layer (e.g., in addition to, or alternatively to the electrical conductor footprint regions) to control a flow of current towards a desired outcome.

Example Mutual Capacitance Control Embodiments

Embodiments for controlling a mutual capacitance of signal conductors of a circuit board are provided in this section. In an embodiment, a surface profile of a reference circuit board insulating layer (e.g., a solder mask layer) covering signal conductors is modified to reduce a mutual capacitance between unrelated signal conductors. In another embodiment, a surface profile of a reference circuit board insulating layer covering signal conductors is modified to increase a mutual capacitance between related signal conductors (e.g., a differential pair). In embodiments, the mutual capacitance is reduced or increased in a manner that does not adversely impact routing density.

The example embodiments described herein are provided for illustrative purposes, and are not limiting. Although described below with reference to printed circuit boards (PCBs) and integrated circuit package substrates, the examples described herein may be adapted to other types of circuit boards. Furthermore, additional structural and operational embodiments, including modifications/alterations, will become apparent to persons skilled in the relevant art(s) from the teachings herein.

Figure 10:
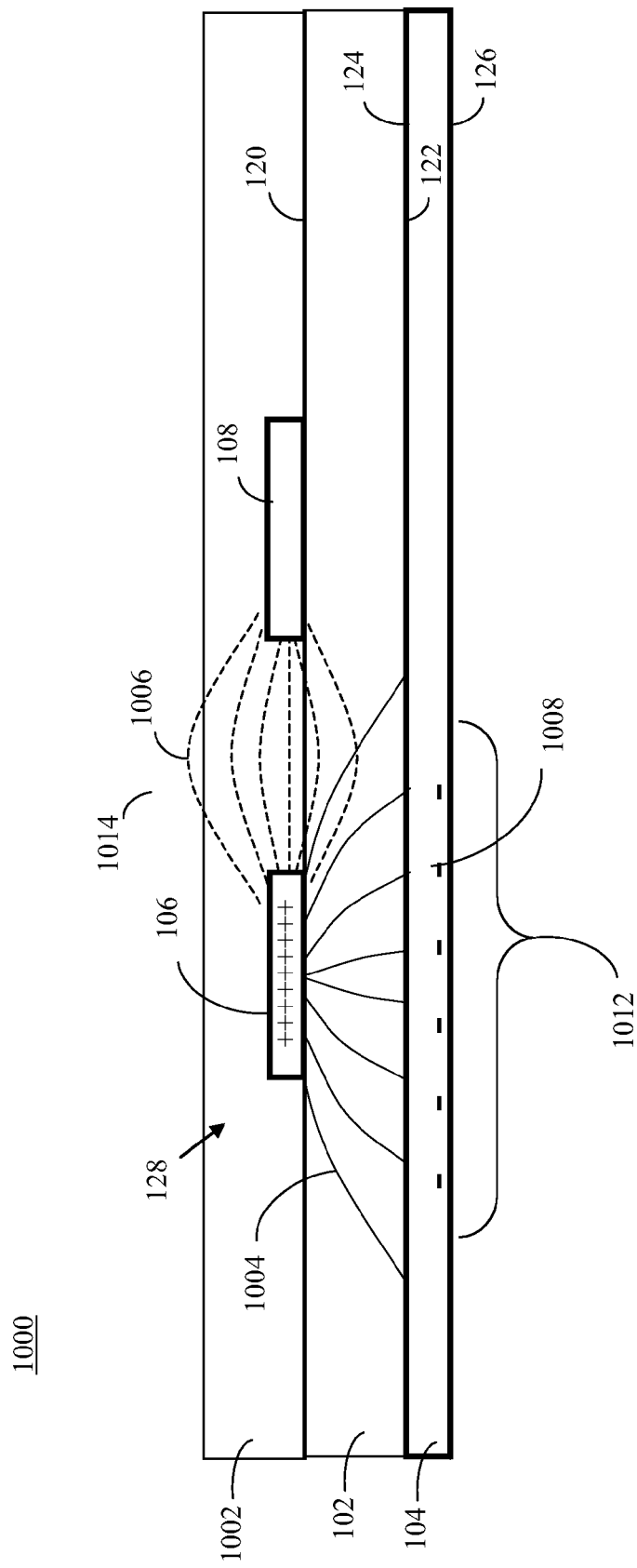
FIG. 10 shows a cross-sectional view of a circuit board that includes a transmission line, and show electric fields related to the transmission line.
Figure 11:
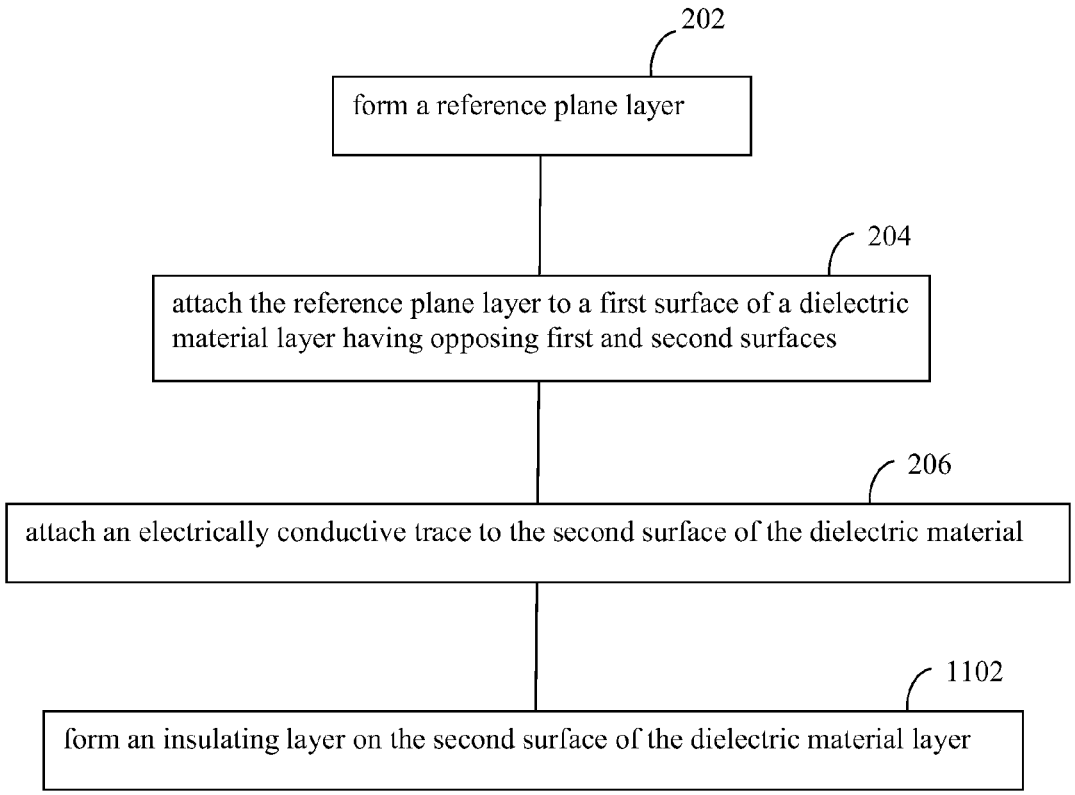
FIG. 11 shows a flowchart for forming a circuit board.

FIG. 10 shows a cross-sectional view of a circuit board 1000 that includes transmission line 128. Circuit board 1000 is generally similar to circuit board 100 shown in FIG. 1, with differences described as follows. As shown in FIG. 10, circuit board 1000 includes dielectric material layer 102, reference plane layer 104, first and second electrical conductors 106 and 108, and an insulating layer 1002. FIG. 11 shows a flowchart 1100 for forming a circuit board that includes a transmission line, such as circuit board 1000. Flowchart 1100 includes steps 202, 204, and 206 of flowchart 200 shown in FIG. 2 and described above, and further includes a step 1102. Step 1102 is described as follows.

In step 1102 of flowchart 1100, an insulating layer is formed on the second surface of the dielectric material layer. As shown in the example of FIG. 10, insulating layer 1002 is formed on second surface 120 of dielectric material layer 102. Insulating layer 1002 covers first and second electrical conductors 106 and 108 on dielectric material layer 102. Insulating layer 1002 may be any suitable insulating/dielectric material, such as an epoxy, a mold compound, and/or a plastic or polymer layer, such as a solder mask layer. Insulating layer 1002 may be formed in any manner, as would be known to persons skilled in the relevant art(s). For example, insulating layer 1002 may be formed according to a spraying process, a silkscreen process, a vacuum lamination process, or any other suitable process, as would be known to persons skilled in the relevant art(s). Insulating layer 1002 may be applied to circuit board 1000 to provide a protective coating for first and second electrical conductors 106 and 108 to avoid short circuits, to facilitate automatic surface mount attachment of chips/devices on circuit board 1000 (e.g., using solder reflow), and/or for other purpose.

The mutual capacitance between two adjacent transmission lines on a common circuit board is a major factor in determining important characteristics such as crosstalk and differential impedance (where the adjacent transmission lines belong to a differential pair) of those transmission lines. The mutual capacitance is directly proportional to the relative permittivity (effective dielectric constant) of the dielectric medium that separates the two transmission lines. The mutual capacitance is directly proportional to the area of overlap between the two transmission lines. Furthermore, the mutual capacitance is inversely proportional to the distance between the two transmission lines.

FIG. 10 shows electric fields related to the operation of first electrical conductor 106. FIG. 10 shows a first electric field 1004 radiating between first electrical conductor 106 and reference plane layer 104. In the example of FIG. 10, first electrical conductor 106 is shown as having a positive charge, and reference plane layer 104 is shown as having a negative charge (in a return current portion 1012). First electric field 1004 is shown mainly radiating through dielectric material layer 102. FIG. 10 also shows a second electric field 1006 radiating between first electrical conductor 106 and second electrical conductor 108. Second electric field 1006 is shown radiating through dielectric material layer 102, insulating layer 1002, and an air space 1014 above circuit board 1000.

The mutual capacitance between two signal conductors is related to the effective dielectric constant of the material between them. Thus, the mutual capacitance between first electrical conductor 106 and second electrical conductor 108 is related to the effective dielectric constant of dielectric material layer 102, insulating layer 1002, and an air space 1014. The shortest path between first electrical conductor 106 and second electrical conductor 108 is through insulating layer 1002, and thus insulating layer 1002 is a significant determiner of the effective dielectric constant. The mutual capacitance between two signal traces increases as the routing density increases (e.g., as the spacing between them decreases). For circuit board 1000, a proximity of reference plane layer 104 to conductors 106 and 108 aids in reducing mutual capacitance. However, manufacturing challenges and impedance control requirements may pose limitations on how close reference plane(s) can be located to signal traces. As a result, there tends to be some amount of mutual capacitance between adjacent signal traces on a circuit board. Furthermore, as the logic noise margins of transmission line signals are reduced, a system level crosstalk budget is also reduced.

Figure 12:
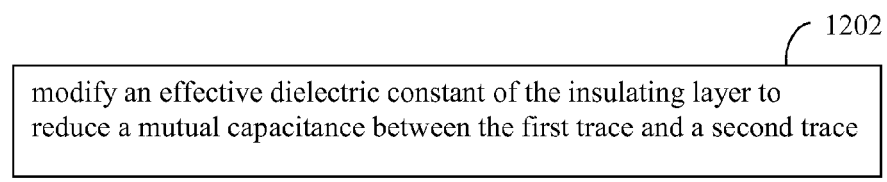
FIG. 12 shows a process for modifying a circuit board to reduce mutual capacitance between adjacent electrical conductors, according to an example embodiment of the present invention.

Embodiments of the present invention reduce the mutual capacitance between adjacent signal traces in a manner that does not compromise routing density. FIG. 12 shows a process for modifying a circuit board to reduce mutual capacitance between adjacent electrical conductors, according to an example embodiment of the present invention. FIG. 12 shows a step 1202, which may be incorporated into flowchart 1100 shown in FIG. 11. For example, step 1202 may be performed during step 1102 of flowchart 1100. Step 1202 is described below. Other structural and operational embodiments will be apparent to persons skilled in the relevant art(s) based on the discussion regarding step 1202.

In step 1202, an effective dielectric constant of the insulating layer is modified to reduce a mutual capacitance between the first trace and a second trace. For example, referring to FIG. 10, the effective dielectric constant of insulating layer 1002 may be modified to reduce a mutual capacitance between first and second electrical conductors 106 and 108.

Figure 13:
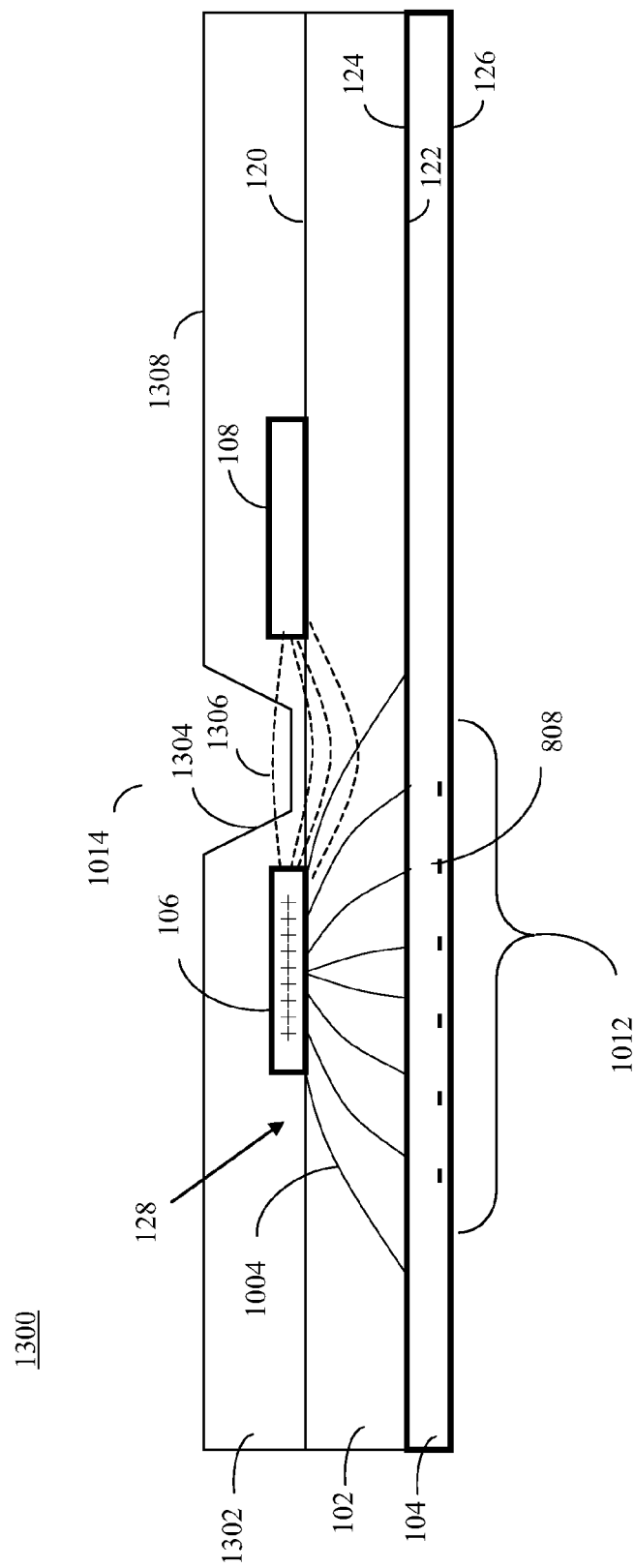
FIG. 13 shows a cross-sectional view of a circuit board having a modified insulating layer, according to an example embodiment of the present invention.

For example, FIG. 13 shows a cross-sectional view of a circuit board 1300 having a modified insulating layer, according to an example embodiment of the present invention. Circuit board 1300 is similar to circuit board 1000 shown in FIG. 10, with differences described below. As shown in FIG. 13, circuit board 1300 includes dielectric material layer 102, reference plane layer 104, first and second electrical conductors 106 and 108, and an insulating layer 1302. Insulating layer 1302 is similar to insulating layer 1002 described above, with difference described as follows. A surface 1308 of insulating layer 1302 is modified (according to step 1202) to include a trench 1304. Trench 1304 is formed in a region of insulating layer 1302 between first and second electrical conductors 106 and 108.

The formation of trench 1304 in insulating layer 1302 modifies insulating layer 1302 such that air space 1014 additionally includes an open space created by trench 1304. Air space 1014 has a lower dielectric constant than insulating layer 1302. Thus, the formation of trench 1304 in insulating layer 1302 reduces an effective dielectric constant of the material between first and second electrical conductors 106 and 108, relative to the configuration shown in FIG. 10. As shown in FIG. 13, a second electric field 1306 radiates between first and second electrical conductors 106 and 108. Due to the lower effective dielectric constant of air space 1014 relative to insulating layer 1302 and dielectric material layer 102, the field lines of second electric field 1306 are weaker between first and second electrical conductors 106 and 108, and tend to concentrate in dielectric material layer 102 and the portion of insulating layer 1302 that is present between trench 1304 and dielectric material layer 102. Thus, the addition of trench 1304 in insulating layer 1302 between first and second electrical conductors 106 and 108 reduces a mutual capacitance between first and second electrical conductors 106 and 108 by reducing the effective dielectric constant. The reduced mutual capacitance causes a reduced amount of undesirable crosstalk between first and second electrical conductors 106 and 108.

Note that the form of trench 1304 shown in FIG. 13 is provided for purposes of illustration. Trench 1304 (also referred to as a "groove") may have any suitable width, length, depth, shape, and number of turns/angled portions, as would be understood by persons skilled in the relevant art(s) in light of the teachings provided herein. Although shown as having a trapezoidal cross section in FIG. 13, trench 1304 may have a rectangular or other shape cross-section. A width and/or depth of trench 1304 may be selected to adjust an effective dielectric constant of the material between conductors 106 and 108. For example, in an embodiment (as shown in FIG. 13) trench 1304 may penetrate a portion of the thickness of insulating layer 1302. In another embodiment, trench 1304 may have a thickness equal to the thickness of insulating layer 1302, to expose surface 120 of dielectric material layer 102 in trench 1304. In still another embodiment, trench 1304 may be formed completely through insulating layer 1302 and partially through the thickness of dielectric material layer 102. Trench 1304 may be formed in any manner, including by etching (e.g., chemical etching), drilling, laser, or by other technique.

Figure 14:
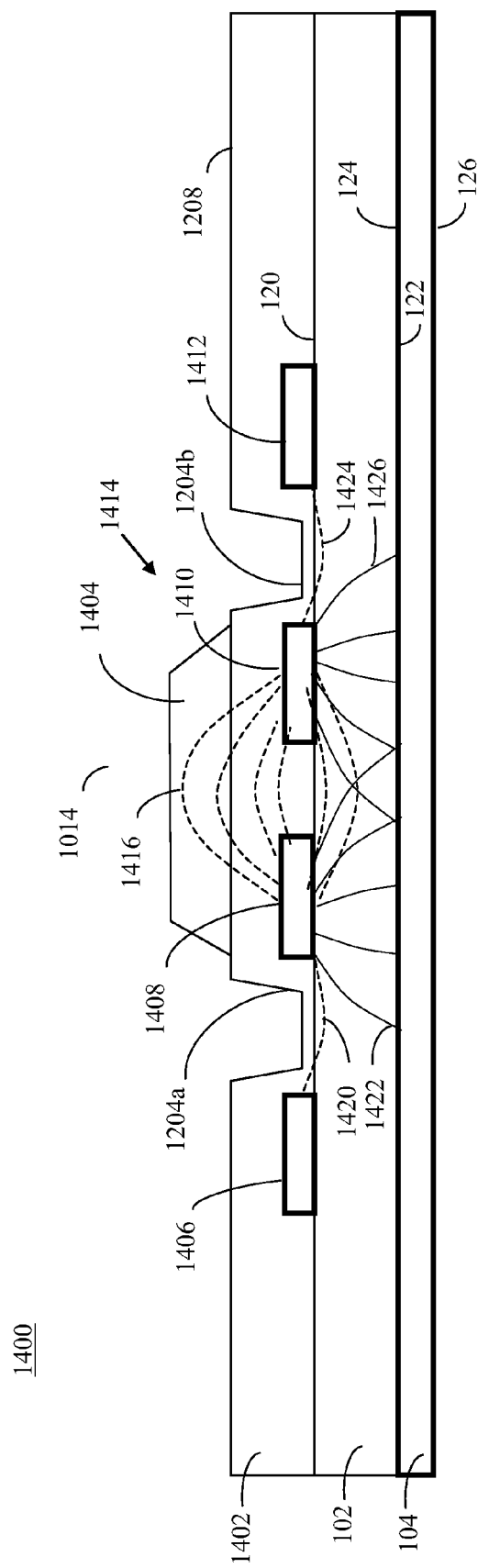
FIG. 14 shows a cross-sectional view of a circuit board having a modified insulating layer, according to another example embodiment of the present invention.

FIG. 14 shows a cross-sectional view of a circuit board 1400 having a modified insulating layer, according to another example embodiment of the present invention. Circuit board 1400 is similar to circuit board 1300 shown in FIG. 13, with differences described below. As shown in FIG. 14, circuit board 1400 includes dielectric material layer 102, reference plane layer 104, an insulating layer 1402, a differential signal pair 1414 that includes a first electrical conductor 1408 and a second electrical conductor 1410, a third electrical conductor 1406, and a fourth electrical conductor 1412. A surface 1308 of insulating layer 1302 is modified (according to step 1202) to include a first trench 1304a and a second trench 1304b. Trench 1304a is formed in a region of insulating layer 1402 between differential signal pair 1414 and third electrical conductor 1406. Trench 1304b is formed in a region of insulating layer 1402 between differential signal pair 1414 and fourth electrical conductor 1412.

As shown in FIG. 14, the formation of trenches 1304a and 1304b in insulating layer 1402 modifies insulating layer 1402 such that air space 1014 additionally includes the open space created by trenches 1304a and 1304b. Air space 1014 has a lower dielectric constant than insulating layer 1402. Thus, the formation of trench 1304a in insulating layer 1402 reduces an effective dielectric constant of the material between differential signal pair 1414 and third electrical conductor 1406, and the formation of trench 1304b in insulating layer 1402 reduces an effective dielectric constant of the material between differential signal pair 1414 and fourth electrical conductor 1412.

As shown in FIG. 14, a first electric field 1416 radiates between first and second electrical conductors 1408 and 1410 of differential signal pair 1414. A second electric field 1420 radiates between first electrical conductor 1408 and third electrical conductor 1406. A third electric field 1424 radiates between second electrical conductor 1410 and fourth electrical conductor 1412. Due to the lower effective dielectric constant of air space 1014 relative to insulating layer 1402 and dielectric material layer 102, the field lines of second and third electric field 1420 and 1424 are weaker between their corresponding electrical conductors (relative to second electrical field 1006 shown in FIG. 10), and tend to concentrate in dielectric material layer 102 and the portions of insulating layer 1402 between trenches 1304a and 1304b and dielectric material layer 102. Thus, the addition of trenches 1304a and 1304b in insulating layer 1402 respectively reduces a mutual capacitance between differential signal pair 1414 and third electrical conductor 1406, and between differential signal pair 1414 and fourth electrical conductor 1412. The reduced mutual capacitance causes a reduced amount of undesirable crosstalk between differential signal pair 1414 and third electrical conductor 1406, and between differential signal pair 1414 and fourth electrical conductor 1412.

In another embodiment, a mutual capacitance between conductors of a differential signal pair may be increased to improve a coupling between the differential pair conductors. For example, FIG. 14 also shows surface 1308 of insulating layer 1402 modified to include a protruding portion 1404 over differential signal pair 1414. The formation of protruding portion 1404 modifies insulating layer 1402 such that a greater amount of insulating material is present over differential signal pair 1414 relative to an amount of insulating material if insulating layer 1402 had the uniform thickness shown in FIG. 10. Such a configuration increases an effective dielectric constant of the material between first and second electrical conductors 1408 and 1410, because insulating material 1402 has a higher dielectric constant than air space 1014. The higher effective dielectric constant increases a mutual capacitance between first and second electrical conductors 1408 and 1410, and thus strengthens first electric field 1416 between first and second electrical conductors 1408 and 1410. In this manner, protruding portion 1404 strengthens an amount of coupling between first and second electrical conductors 1408 and 1410 of differential signal pair 1414, which can increase a quality of the electrical signal carried by differential signal pair 1414.

Note that in an embodiment, formation of a trench or other feature in insulating layer 1402 between unrelated electrical conductors, and formation of a protruding portion on insulating layer 1402 adjacent to related electrical conductors (e.g., differential signal pair 1414) may be used to effectively control a differential impedance of the related electrical conductors and the differential mode crosstalk with adjacent unrelated electrical conductors. Alternatively, protruding portion 1404 may be used in an embodiment without usage of trenches.

As shown in FIG. 14, protruding portion 1404 may have a width approximately equal to the width of differential signal pair 1414. In other embodiments, protruding portion 1404 may have a width greater than or less than a width of differential signal pair 1414. A height of protruding portion 1404 from surface 1308 may be greater than, equal to, or less than (as shown in FIG. 14) an average thickness of insulating layer 1402. The shape, width, and height of protruding portion 1404 shown in FIG. 14 are provided for purposes of illustration. Protruding portion 1404 may have any suitable size, shape, height, and width, as would be known to persons skilled in the relevant art(s). For example, protruding portion 1404 may have a planar shape (as in FIG. 14), may be rounded, or may have other shape, as desired for a particular application. A size and/or type of material (e.g., having a particular dielectric constant) of protruding portion 1404 may be selected to adjust the effective dielectric constant between conductors 1408 and 1410 of differential signal pair 1414.

Protruding portion 1404 may be formed in any manner. For example, in an embodiment, protruding portion 1404 may be a strip of insulating material that is attached to surface 1308. Protruding portion 1404 may be attached to surface 1308 in any manner, including by an adhesive material (e.g., an epoxy), by lamination, by printing insulating material on surface 1308 (e.g., by inkjet printing), or in any other manner. Protruding portion 1404 may be a same or different material from insulating layer 1402, including a mold compound, or a plastic or polymer, such as a solder resist material. In another embodiment, protruding portion 1404 is an integral part of insulating layer 1402, and thus may be formed during the fabrication process for insulating layer 1402. For example, insulating layer 1402, with protruding portion 1404, may be formed in a mold, may be formed by an etching process (e.g., photolithography), or by other suitable process described elsewhere herein or otherwise known.

FIG. 15 shows a flowchart 1500 providing a process for operating a circuit board, according to an embodiment of the present invention. For example, a circuit board including either of insulating layers 1302 or 1402 of FIGS. 13 and 14 may be operated according to flowchart 1500. Flowchart 1500 begins with step 1502. In step 1502, a forward current is enabled to flow through a signal line and a corresponding return current is enabled to flow through the return signal path of the reference plane to generate an electric field. During operation of electrical components of the circuit board, a forward current may flow through first electrical conductor 106 (FIG. 13) or one of electrical conductors 1408 and 1410 (FIG. 14). A return current may flow through reference plane layer 104 (FIG. 13) or through the other of electrical conductors 1408 and 1410 (FIG. 14).

In step 1504, a coupling of the electric field between the first trace and the second trace is reduced due to the reduced mutual capacitance. As described above, by configuring an insulating layer with a trench between electrical conductors, an electric field coupling between the electrical conductors may be reduced, and the mutual capacitance between the electrical conductors may be reduced. In this manner, transmission lines of a circuit board can be configured to interfere with each other less, and may be formed more closely together, if desired.

In an embodiment, flowchart 1500 may include a step where a coupling of the electric field between a pair of traces is increased due to an increased mutual capacitance. As described above, by configuring an insulating layer with a protruding portion over a pair of electrical conductors, an electric field coupling between the electrical conductors may be increased, and the mutual capacitance between the electrical conductors may be increased. In this manner, transmission lines pairs of a circuit board can be configured to be more tightly coupled.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A circuit board, comprising:
   a dielectric material layer having opposing first and second surfaces;
   a reference plane layer having opposing first and second surfaces, wherein the first surface of the reference plane layer is attached to the first surface of the dielectric material layer; and
   an electrically conductive trace on the second surface of the dielectric material;
   wherein a first portion of the reference plane layer along and directly opposite the trace includes a first amount of an electrically conductive material, and a second portion of the reference plane layer adjacent to the first portion includes a second amount of an electrically conductive material; and
   wherein the first amount is greater than the second amount, the second amount being a non-zero amount.

2. The circuit board of claim 1, wherein the first portion of the reference plane layer has a thickness that is greater than a thickness of the second portion of the reference plane layer.

3. The circuit board of claim 2, further comprising:
   a trench in the first surface of the reference plane layer in the second portion of the reference plane layer.

4. The circuit board of claim 3, further comprising:
   a second trench in the first surface of the reference plane layer adjacent to the first portion on an opposite side of the first portion from the second portion.

5. The circuit board of claim 2, wherein the first portion of the reference plane layer includes:
   a protruding portion along the first portion of the reference plane layer directly opposite the trace.

6. The circuit board of claim 5, wherein the protruding portion has a width approximately equal to a width of the trace.

7. The circuit board of claim 1, wherein the second portion of the reference plane layer includes at least one opening in the first surface of the reference plane layer.

8. A method for forming a circuit board, comprising:
   forming a reference plane layer having opposing first and second surfaces;
   attaching the first surface of the reference plane layer to a first surface of a dielectric material layer having opposing first and second surfaces; and
   attaching an electrically conductive trace to the second surface of the dielectric material;
   wherein said forming a reference plane layer comprises
      modifying a surface profile of the reference plane layer to decrease a resistance of a return current signal path through the reference plane layer, the modifying including forming a first portion of the reference plane layer opposite the trace to have a thickness that is greater than a thickness of a second portion of the reference plane layer adjacent to the first portion, the thickness of the second portion of the reference plane layer being non-zero.

9. The method of claim 8, wherein said forming the first portion of the reference plane layer opposite the trace to have a thickness that is greater than a thickness of the second portion of the reference plane layer adjacent to the first portion comprises:
   forming a trench in the first surface of the reference plane layer in the second portion of the reference plane layer.

10. The method of claim 9, further comprising:
   forming a second trench in the first surface of the reference plane layer adjacent to the first portion on the opposite side of the first portion from the second portion.

11. A method for forming a circuit board, comprising:
   forming a reference plane layer having opposing first and second surfaces;
   attaching the first surface of the reference plane layer to a first surface of a dielectric material layer having opposing first and second surfaces; and
   attaching an electrically conductive trace to the second surface of the dielectric material;
   wherein said forming a reference plane layer comprises
      modifying a surface profile of the reference plane layer to decrease a resistance of a return current signal path through the reference plane layer, said modifying including forming a protruding portion along a first portion of the reference plane layer directly opposite the trace.

12. The method of claim 11, wherein said forming a protruding portion further comprises:
   forming the protruding portion to have a width approximately equal to a width of the trace.

13. A method for forming a circuit board, comprising:
   forming a reference plane layer having opposing first and second surfaces;
   attaching the first surface of the reference plane layer to a first surface of a dielectric material layer having opposing first and second surfaces; and
   attaching an electrically conductive trace to the second surface of the dielectric material;

wherein said forming a reference plane layer comprises:
modifying a surface profile of the reference plane layer to decrease a resistance of a return current signal path through the reference plane layer, said modifying including:
forming at least one opening in the first surface of the reference plane layer in a second portion of the reference plane layer that is adjacent to a first portion of the reference plane layer positioned opposite the trace, and
forming a protruding portion along the first portion of the reference plane layer directly opposite the trace.

14. The method of claim 11, wherein said modifying further includes forming a trench in the first surface of the reference plane layer in a second portion of the reference plane layer adjacent to the first portion of the reference plane layer.

15. The method of claim 14, wherein said modifying further includes forming a second trench in the first surface of the reference plane layer adjacent to the first portion on an opposite side of the first portion from the second portion.

16. The method of claim 13, wherein the at least one opening is formed partially through the reference plane layer.

17. The method of claim 13, wherein said forming a protruding portion further comprises:
forming the protruding portion to have a width approximately equal to a width of the trace.

18. The method of claim 13, further comprising:
attaching a second electrically conductive trace to the second surface of the dielectric material; and
wherein said modifying further includes:
forming at least one second opening in the first surface of the reference plane layer in a fourth portion of the reference plane layer that is adjacent to a third portion of the reference plane layer positioned opposite the second trace, and
forming a second protruding portion along the third portion of the reference plane layer directly opposite the second trace.

19. The method of claim 18, wherein the at least one second opening is formed partially through the reference plane layer.

20. The method of claim 18, wherein said forming a second protruding portion further comprises:
forming the second protruding portion to have a width approximately equal to a width of the second trace.

* * * * *